US012451592B2

(12) United States Patent
Yoon et al.

(10) Patent No.: US 12,451,592 B2
(45) Date of Patent: Oct. 21, 2025

(54) ANTENNA POWER FEEDING STRUCTURE COMPRISING FLEXIBLE PRINTED CIRCUIT BOARD, AND ELECTRONIC DEVICE COMPRISING SAME

(71) Applicant: Samsung Electronics Co., Ltd., Suwon-si (KR)

(72) Inventors: Chongo Yoon, Suwon-si (KR); Sunghyup Lee, Suwon-si (KR); Kwonho Son, Suwon-si (KR); Mincheol Seo, Suwon-si (KR); Yoonjung Kim, Suwon-si (KR); Hyungjin Kim, Suwon-si (KR); Jungsik Park, Suwon-si (KR); Sangyoup Seok, Suwon-si (KR); Donghun Shin, Suwon-si (KR); Seongyong An, Suwon-si (KR); Kyungjae Lee, Suwon-si (KR); Huiwon Cho, Suwon-si (KR); Heeseok Jung, Suwon-si (KR); Hyunju Hong, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 194 days.

(21) Appl. No.: 18/327,369

(22) Filed: Jun. 1, 2023

(65) Prior Publication Data
US 2023/0307821 A1 Sep. 28, 2023

Related U.S. Application Data

(63) Continuation of application No. PCT/KR2021/017381, filed on Nov. 24, 2021.

(30) Foreign Application Priority Data

Dec. 2, 2020 (KR) .......................... 10-2020-0166653

(51) Int. Cl.
H01Q 1/24 (2006.01)
H01Q 1/38 (2006.01)
H01Q 1/46 (2006.01)

(52) U.S. Cl.
CPC ............. *H01Q 1/243* (2013.01); *H01Q 1/38* (2013.01); *H01Q 1/46* (2013.01)

(58) Field of Classification Search
CPC .......... H01Q 1/243; H01Q 1/38; H01Q 1/46; H01Q 1/2283; H01Q 1/48; H01Q 1/24;
(Continued)

(56) References Cited

U.S. PATENT DOCUMENTS 9,287,627 B2 * 3/2016 Jarvis ..................... H01Q 1/243
10,199,719 B2 2/2019 Kim et al.
(Continued)

FOREIGN PATENT DOCUMENTS

KR 20140139520 A 12/2014
KR 20150080944 A 7/2015
(Continued)

OTHER PUBLICATIONS

Extended European Search Report dated Mar. 28, 2024 for EP Application No. 21900912.3.
(Continued)

*Primary Examiner* — Seung H Lee
(74) *Attorney, Agent, or Firm* — Nixon & Vanderhye P.C.

(57) ABSTRACT

An electronic device may include: a main substrate; a frame having at least one part exposed outside the electronic device, and formed from a metal material; a flexible printed circuit board having at least one part disposed adjacent to the frame; a first connecting part for electrically connecting the flexible printed circuit board and the main substrate; a second connecting part formed to be bendable to electrically connect the flexible printed circuit board and the frame; and
(Continued)

an integrated circuit disposed on, directly or indirectly, the flexible printed circuit board. Various other embodiments are possible.

15 Claims, 10 Drawing Sheets

(58) Field of Classification Search
CPC .. H04M 1/0277; H04M 1/026; H05K 1/0215; H05K 1/0219; H05K 1/111; H05K 2201/056; H05K 2201/09618; H05K 2201/10098; H05K 2201/10189; H05K 2201/1028; H05K 2201/10409; H05K 2201/2018; H05K 1/0243; H05K 1/147; H05K 1/189
See application file for complete search history.

(56) References Cited

U.S. PATENT DOCUMENTS

| | | |
|---|---|---|
| 10,447,326 B2 | 10/2019 | Song et al. |
| 11,019,190 B2 | 5/2021 | Kim et al. |
| 2013/0257659 A1 | 10/2013 | Darnell et al. |
| 2014/0218874 A1 | 8/2014 | Malek et al. |
| 2015/0188230 A1 | 7/2015 | Kim et al. |
| 2016/0226132 A1 | 8/2016 | Kim et al. |
| 2017/0237845 A1 | 8/2017 | Yoo et al. |
| 2019/0081694 A1 | 3/2019 | Zhou et al. |
| 2019/0104212 A1 | 4/2019 | Lee et al. |
| 2019/0207300 A1 | 7/2019 | Wu et al. |
| 2019/0384358 A1 | 12/2019 | Choe et al. |
| 2020/0136243 A1 | 4/2020 | Shin et al. |
| 2022/0174819 A1 | 6/2022 | Kim et al. |

FOREIGN PATENT DOCUMENTS

| | | |
|---|---|---|
| KR | 101741585 B1 | 5/2017 |
| KR | 20190038264 A | 4/2019 |
| KR | 20190141852 A | 12/2019 |
| KR | 20200009251 A | 1/2020 |
| KR | 10-2020-0036460 A | 4/2020 |
| KR | 20200120349 A | 10/2020 |
| KR | 102288451 B1 | 8/2021 |

OTHER PUBLICATIONS

International Search Report for PCT/KR2021/017381 mailed Mar. 4, 2022, 3 pages.
Written Opinion of the ISA for PCT/KR2021/017381 mailed Mar. 4, 2022, 4 pages.
Korean Office Action dated Jan. 22, 2025 for KR Application No. 10-2020-0166653.

* cited by examiner

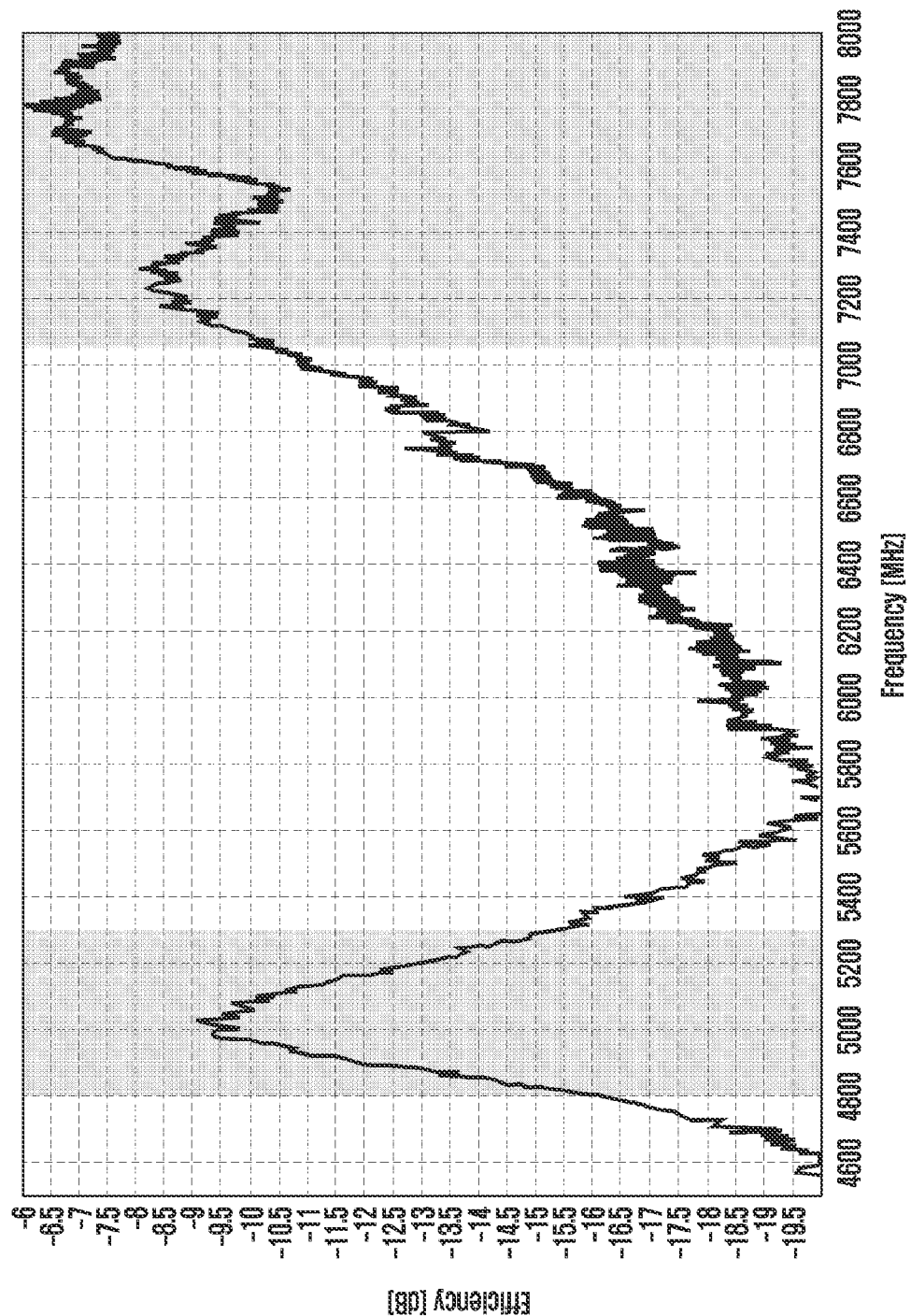

(a)

(b)

ANTENNA POWER FEEDING STRUCTURE COMPRISING FLEXIBLE PRINTED CIRCUIT BOARD, AND ELECTRONIC DEVICE COMPRISING SAME

CROSS-REFERENCE TO RELATED APPLICATIONS

This application is a continuation of International Application No. PCT/KR2021/017381, designating the United States, filed on Nov. 24, 2021, in the Korean Intellectual Property Receiving Office, and claiming priority to KR Patent Application No. 10-2020-0166653 filed on Dec. 2, 2020, in the Korean Intellectual Property Office, the disclosures of all of which are hereby incorporated by reference herein in their entireties.

BACKGROUND

Field

Various example embodiments relate to an antenna power feeding structure including a flexible printed circuit board, and/or an electronic device including the antenna power feeding structure.

Description of Related Art

In line with portable electronic device design trends, there have been increasing demands for electronic devices having an exterior metal applied thereto.

In the case of an electronic device having a metallic frame as the exterior thereof, disposition of an antenna inside the frame may be limited. In order to overcome this, a scheme in which the metallic frame is used as an antenna radiator so as to implement a multi-band antenna and to secure radiation performance has been applied.

Meanwhile, additional service bands may be added since commencement of 5G services. As a result, a larger number of antenna radiators than existing ones may be required.

In order for an electronic device having a metallic frame as the exterior thereof to use the frame as an antenna, a circuit portion and the frame need to be electrically connected. The circuit portion may be disposed on, directly or indirectly, a normal printed circuit board. The normal printed circuit board is not easily deformable. Therefore, in order to connect the circuit portion and the frame, it is customary to use a structure in which the printed circuit board is extended to the inside of the frame, and the frame and the printed circuit board are then connected.

In order to transmit a large amount of data at a high transmission rate, technologies such as multi input multi output (MIMO), carrier aggregation (CA), and e-utran new radio dual connectivity (ENDC) need to be applied, and the number of antennas has increased to implement this. Consequently, the number of antennas connected to a metallic frame is increased. The area in which the printed circuit board is expanded is also increased to be connected to the increased number of antennas, and such expansion is also restricted by the imitation of the inner space of the electronic device.

SUMMARY

Various example embodiments may provide an antenna power feeding structure and/or an electronic device including the antenna power feeding structure, wherein the above-mentioned problems may be solved, and the inner space of the electronic device may be effectively used.

An electronic device according to various example embodiments may include a main board, a frame having at least a portion exposed to the outside of the electronic device and formed of a metal material, a flexible printed circuit board having at least a portion disposed to be adjacent, directly or indirectly, to the frame, a first connection part configured to electrically connect, directly or indirectly, the flexible printed circuit board and the main board, a second connection part formed to be bendable and configured to electrically connect, directly or indirectly, the flexible printed circuit board and the frame, and an integrated circuit disposed on, directly or indirectly, the flexible printed circuit board.

An antenna power feeding structure according to various example embodiments may include a flexible printed circuit board disposed to be adjacent to a frame of an electronic device, which is formed of a metal material, a first connection part configured to electrically connect, directly or indirectly, the flexible printed circuit board and a main board of the electronic device, a second connection part formed to be bendable and configured to electrically connect, directly or indirectly, the flexible printed circuit board and the frame of the electronic device, and an integrated circuit disposed on, directly or indirectly, the flexible printed circuit board.

According to various example embodiments, an antenna power feeding structure including a circuit portion connected to a metallic frame may be effectively disposed in a narrow inner space of an electronic device.

BRIEF DESCRIPTION OF DRAWINGS

In connection with the description of the drawings, same or similar reference numerals will be used to refer to same or similar elements.

FIG. 3D is a view showing performance of the additional antenna illustrated in FIG. 3A.

DETAILED DESCRIPTION

Figure 1:
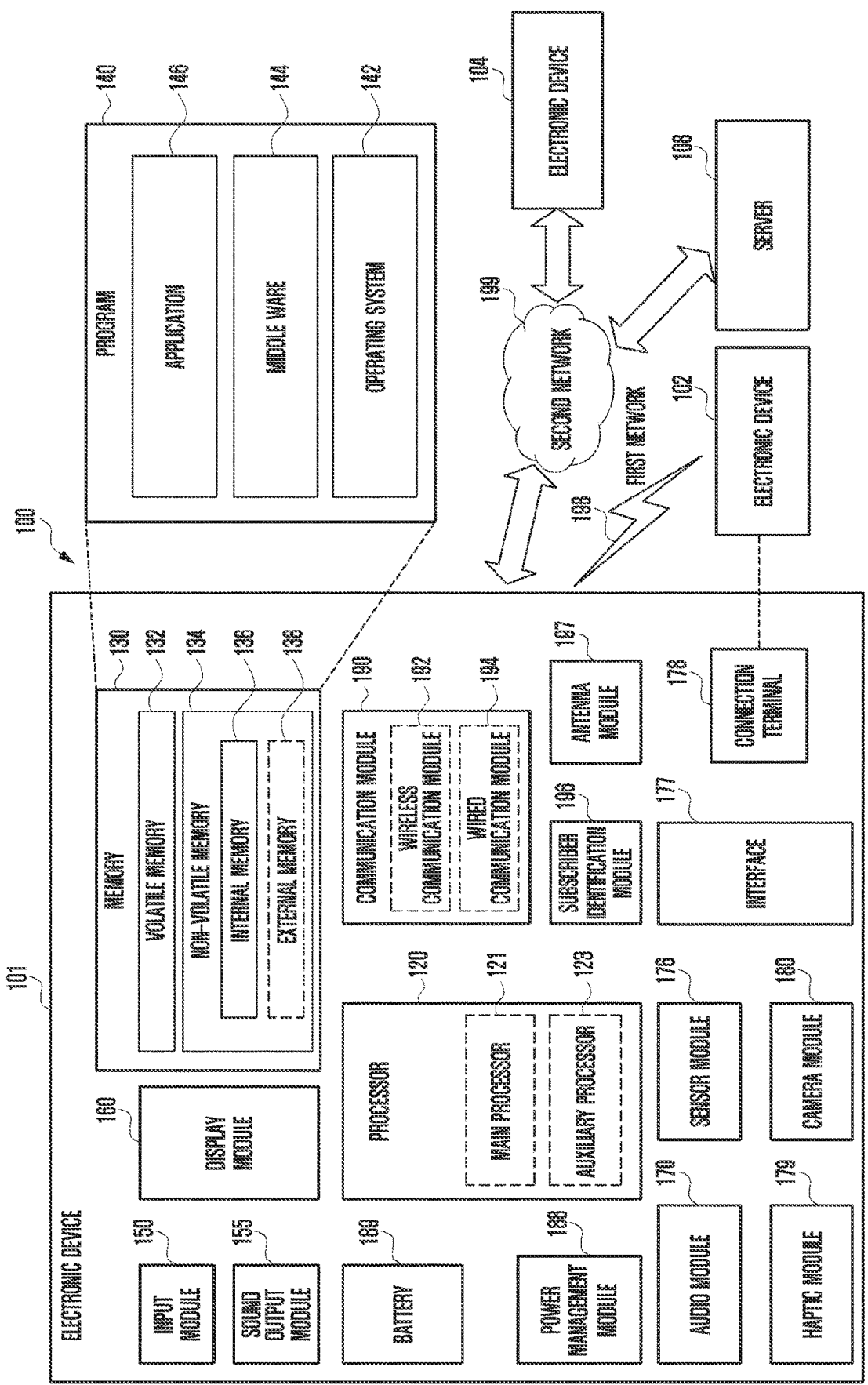
FIG. 1 is a block diagram of an electronic device in a network environment according to various example embodiments.

It should be appreciated that various embodiments of the disclosure and the terms used therein are not intended to limit the technological features set forth herein to particular embodiments and include various changes, equivalents, or alternatives for a corresponding embodiment.

With regard to the description of the drawings, similar reference numerals may be used to designate similar or relevant elements. A singular form of a noun corresponding to an item may include one or more of the items, unless the relevant context clearly indicates otherwise.

As used herein, each of such phrases as "A or B," "at least one of A and B," "at least one of A or B," "A, B, or C," "at least one of A, B, and C," and "at least one of A, B, or C" may include all possible combinations of the items enumerated together in a corresponding one of the phrases. As used herein, such terms as "a first", "a second", "the first", and "the second" may be used to simply distinguish a corresponding element from another, and does not limit the elements in other aspect (e.g., importance or order). It is to be understood that if an element (e.g., a first element) is referred to, with or without the term "operatively" or "communicatively", as "coupled with/to" or "connected with/to" another element (e.g., a second element), it means that the element may be coupled/connected with/to the other element directly (e.g., wiredly), wirelessly, or via at least a third element(s).

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input 1 module 150, a sound output 1 module 155, a display 1 module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display 1 module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input 1 module 150 may receive a command or data to be used by another component (e.g., the processor 120) of the electronic device 101, from the outside (e.g., a user) of the electronic device 101. The input 1 module 150 may include, for example, a microphone, a mouse, a keyboard, a key (e.g., a button), or a digital pen (e.g., a stylus pen).

The sound output 1 module 155 may output sound signals to the outside of the electronic device 101. The sound output 1 module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display 1 module 160 may visually provide information to the outside (e.g., a user) of the electronic device 101.

The display 1 module 160 may include, for example, a display, a hologram device, or a projector and control circuitry to control a corresponding one of the display, hologram device, and projector. According to an embodiment, the display 1 module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input 1 module 150, or output the sound via the sound output 1 module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
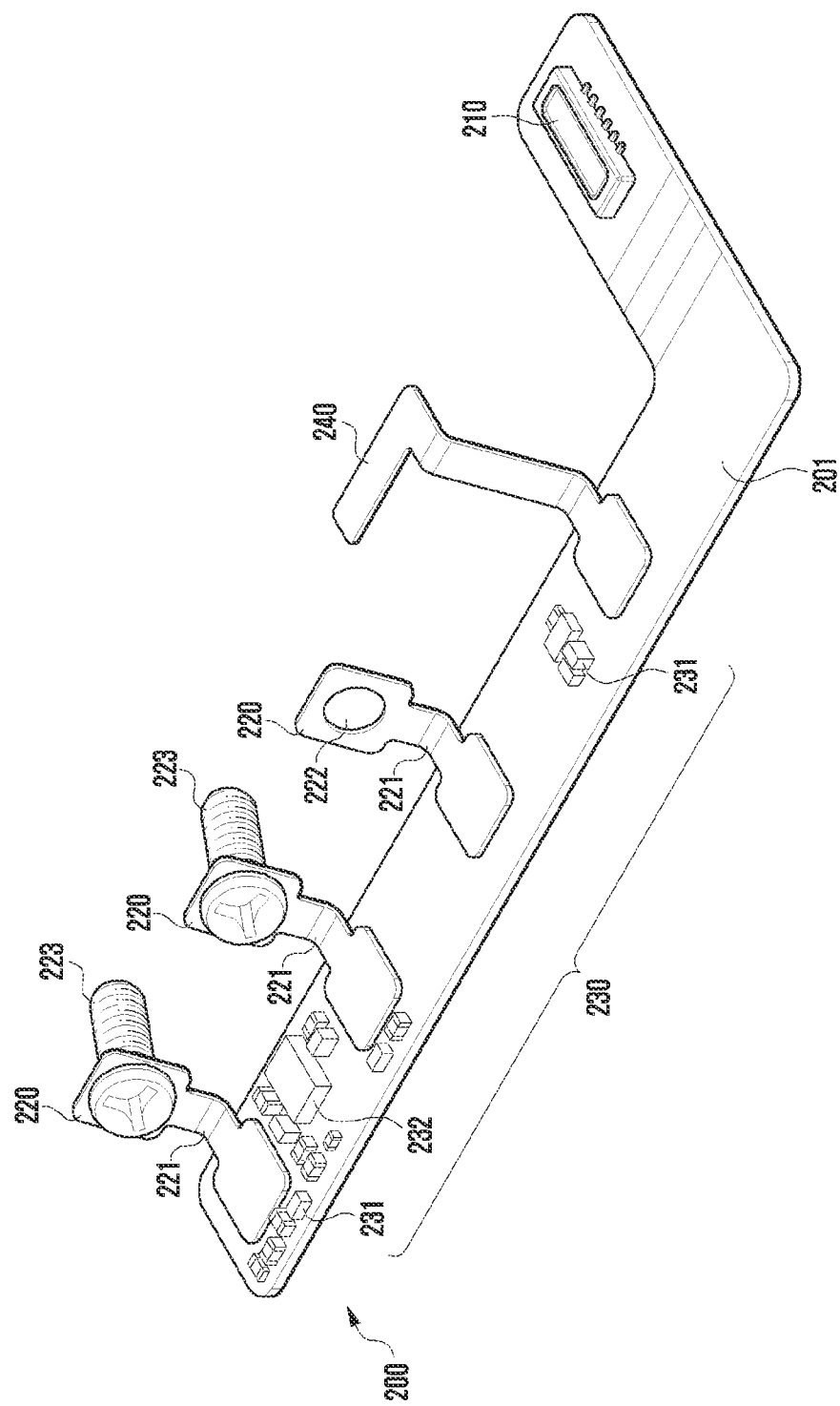
FIG. 2 is a perspective view of an antenna power feeding structure according to various example embodiments.

FIG. 2 is a perspective view of an antenna power feeding structure according to various example embodiments.

An antenna power feeding structure 200 according to various example embodiments may include a flexible printed circuit board (FPCB) 201, a first connection part 210, a second connection part 220, and an integrated circuit 230. The elements of the antenna power feeding structure 200 mentioned above may be merely an example, and any one of the mentioned elements may be omitted from the antenna power feeding structure 200, and elements other than the mentioned elements may be included in the antenna power feeding structure.

According to various embodiments, the flexible printed circuit board 201 may be a substrate which is formed of a flexible material and on which a signal line (e.g., the signal line 410 in FIG. 4A) is disposed. The flexible printed circuit board 201 may also be disposed in a small space, differently from a general printed circuit board formed of a material having low flexibility, and may have a high degree of freedom in manufacturing in terms of shape. Therefore, the flexible printed circuit board 201 may be more advantageous in being disposed in a small space inside an electronic device. For example, the flexible printed circuit board 201 may be manufactured in a shape capable of being disposed in a space between mechanical members or electronic components arranged inside an electronic device. In addition, since the flexible printed circuit board 201 is bendable, the flexible printed circuit board may also be disposed on a surface having a height difference. The flexible printed circuit board 201 may be a base of the antenna power feeding structure 200 disclosed in the document, and various elements may be coupled or connected, directly or indirectly, to the flexible printed circuit board 201.

According to various embodiments, the flexible printed circuit board 201 may be a flexible PCB RF cable (FRC). For example, the flexible printed circuit board 201 may transmit a high frequency signal.

According to various embodiments, a signal line (e.g., the signal line 410 in FIG. 4A) for transmitting a radio frequency (RF) signal may be disposed on the flexible printed circuit board 201. In addition, a ground VIA (e.g., the ground VIA 420 in FIG. 4A) may be disposed around the signal line. Here, in a flexible printed circuit board formed by multiple layers stacked on each other, a ground VIA may include a structure which allow grounds arranged on different layers to be connected, directly or indirectly, in the stacked direction thereof. For example, in case that the flexible printed circuit board 201 includes multiple layers (e.g., the flexible printed circuit board 400A or 400B in FIG. 4A), the ground disposed on the same layer as a signal line may be disposed around the signal line, and the ground disposed on a layer different from the signal line may be disposed at a position overlapping the signal line. Grounds arranged on different layers may be connected, directly or indirectly, to each other in the form of a VIA. Through a signal line, an RF signal generated in a communication module (e.g., the communication module 190 in FIG. 1, comprising communication circuitry) electrically connected to the flexible printed circuit board 201 may be transmitted, and an RF signal received through an antenna may be transmitted. The detailed descriptions of a signal line and a ground VIA will be described later (refer to the descriptions of FIG. 4A).

According to various embodiments, the first connection part 210 may electrically connect, directly or indirectly, the flexible printed circuit board 201 and a main board (e.g., the main board 302 in FIG. 3C) of an electronic device. Here, the main board of an electronic device may include a substrate on which a communication module is disposed, or a substrate electrically connected to a substrate on which a communication module is disposed. The first connection part 210 may electrically connect, directly or indirectly, the flexible printed circuit board 201 and the main board by various methods. The first connection part 210 may connect, directly or indirectly, the flexible printed circuit board 201 and the main board by an electrical connection method such as a soldering method, a clip method, a socket method, or a bolt method. For example, as illustrated in FIG. 2, the first connection part 210 may be a connector having a shape capable of being inserted into a socket. An RF signal generated in a communication module disposed on the main board may be transmitted to the flexible printed circuit board 201 through the first connection part 210. Each "module" herein may comprise circuitry.

According to various embodiments, the second connection part 220 may electrically connect, directly or indirectly, the flexible printed circuit board 201 and a frame (e.g., the frame 304 in FIG. 3C) of an electronic device. The frame of an electronic device may have at least a portion exposed to the outside of an electronic device and formed of a metal material. The frame formed of a metal material may function as an antenna for transmitting or receiving an RF signal. The second connection part 220 may include a bent part 221 which is a bendable area. The second connection part 220 including the bent part 221 may be partially deformed according to the arrangement relationship between the frame and the flexible printed circuit board 201. As described above, as the frame and the flexible printed circuit board 201 are connected by the second connection part 220 of which a partial section is deformable, the degree of freedom in arrangement of the flexible printed circuit board 201 may be improved.

According to various embodiments, the electrical connection between the second connection part 220 and the frame may be made by various methods. The second connection part 220 may be electrically connected to the frame by an electrical connection method such as a soldering method, a clip method, a socket method, or a bolt method. For example, as illustrated in FIG. 2, the second connection part 220 may include a screw hole 222 into which a bolt 223 can be inserted. As the bolt 223 is inserted into the screw hole 222 and thus screw-coupled to the frame, the second connection part 220 may be electrically connected to the frame. Even though an impact is applied from the outside of an electronic device, the coupled state between the second connection part 220 and the frame may be stably maintained. The electrical connection between the second connection part 220 and the flexible printed circuit board 201 may be made by various methods. The second connection part 220 may be electrically connected to the flexible printed circuit board 201 by an electrical connection method such as a soldering method, a clip method, a socket method, or a bolt method. For example, the second connection part 220 may be electrically connected to the flexible printed circuit board 201 through soldering. An RF signal transmitted to the flexible printed circuit board 201 may be transmitted to the frame through the second connection part 220. In addition, an RF signal transmitted from the frame may be transmitted to the flexible printed circuit board 201 through the second connection part 220.

According to various embodiments, as illustrated in FIG. 2, multiple second connection parts 220 may be provided. The multiple second connection parts 220 may be connected to frames (e.g., the first frame 304A and the second frame 304B in FIG. 3C) segmented by an insulation material (e.g., the insulation material 305 in FIG. 3C), respectively. In addition, the multiple second connection parts 220 may be connected to one unsegmented frame.

According to various embodiments, the multiple second connection parts 220 may be connected to the ground of a first frame or an electronic device. The first frame may function as an antenna, and thus the second connection parts 220 connected to the first frame may transmit an RF signal through the first frame. By the integrated circuit 230 described later, the length of an antenna connected to the second connection part 220s may increase or decrease in terms of software or hardware. Here, that the length of an antenna is increased or decreased in terms of hardware may indicate that a switching circuit 232 included in the integrated circuit 230 electrically connects antennas segmented from each other. For example, the ground of an electronic device may indicate one of internal frames of an electronic device, or may indicate a ground terminal formed on a printed circuit board included in an electronic device. At least one of the second connection parts 220 may be connected, directly or indirectly, to the first frame and at least one thereof may be connected, directly or indirectly, to the ground, and thus an antenna may become a planar inverted-f antenna (PIFA).

According to various embodiments, the integrated circuit 230 may be disposed on the flexible printed circuit board 201. For example, the integrated circuit 230 may include various antenna-related circuits such as a matching circuit 231 for impedance matching and the switching circuit 232 allowing the antenna power feeding structure 200 to respond to a broadband characteristic. For example, the switching circuit 232 may short antennas electrically opened from each other so as to increase the physical length of the antennas. The matching circuit 231 capable of being included in the integrated circuit 230 may be disposed on a flexible printed circuit board 201 adjacent to a frame for performing an antenna function in an electronic device. Since the matching circuit 231 is disposed to be adjacent to the frame, loss of an RF signal may be reduced. In an embodiment, the switching circuit 232 may be a tuner.

The matching circuit 231 and the switching circuit 232 of the integrated circuit 230 described above are not limitedly interpreted by the names thereof, and should be understood as including a circuit including an element capable of performing a corresponding function. For example, the switching circuit 232 may be referred to as a switching integrated circuit 232, and the matching circuit 231 may be referred to as a variable element part 231.

According to various embodiments, the integrated circuit 230 may be a radio frequency integrated circuit (RF IC). For example, the integrated circuit 230 may be a circuit operating in a frequency range suitable for wireless transmission. For example, the integrated circuit 230 may include a power amplifier, a low noise amplifier, a phase shifter, and/or a phase detector.

According to various embodiments, the flexible printed circuit board 201 may include at least one additional antenna 240 formed of a conductive material and electrically connected to the flexible printed circuit board 201. For example, the additional antenna 240 may be an antenna capable of transmitting or receiving an a high-frequency (GHz or higher frequency) RF signal. Even though the additional antenna 240 for transmitting or receiving a high frequency RF signal is disposed inside a frame made of a metal material, the performance of the additional antenna 240 may be less affected. For this reason, the additional antenna 240 may be disposed inside the frame. In some cases, a part of the additional antenna 240, which is connected to the flexible printed circuit board 201, may be exposed to the outside of an electronic device. The matching circuit 231 may be disposed at a position adjacent to the additional antenna 240.

Figure 3A:
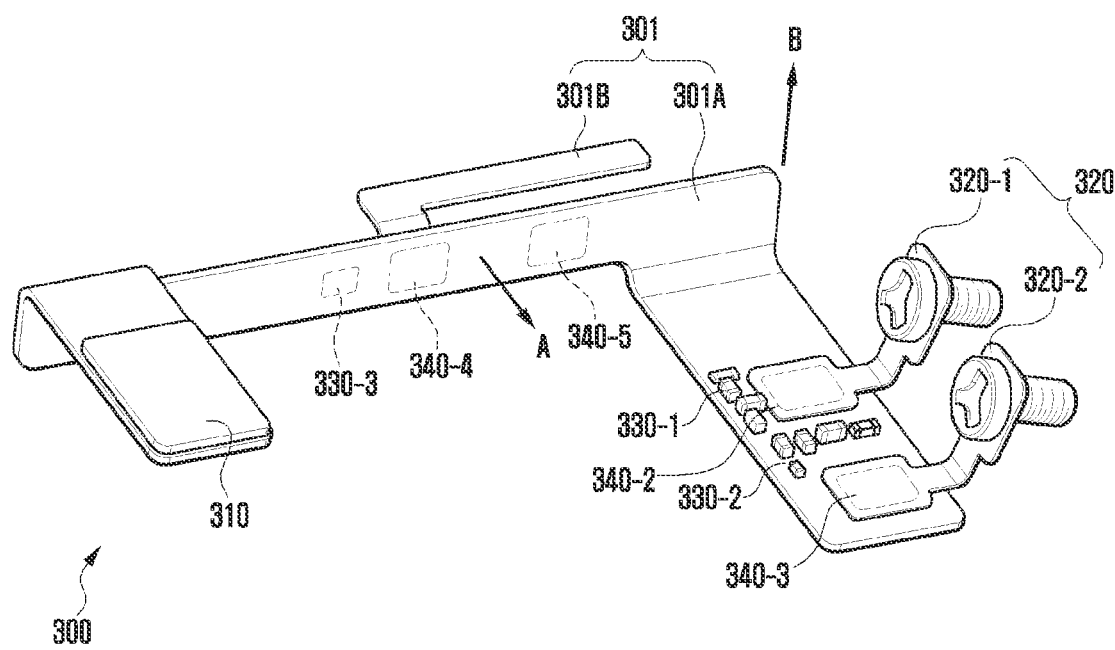
FIG. 3A is a perspective view of an antenna power feeding structure according to various example embodiments.
Figure 3B:
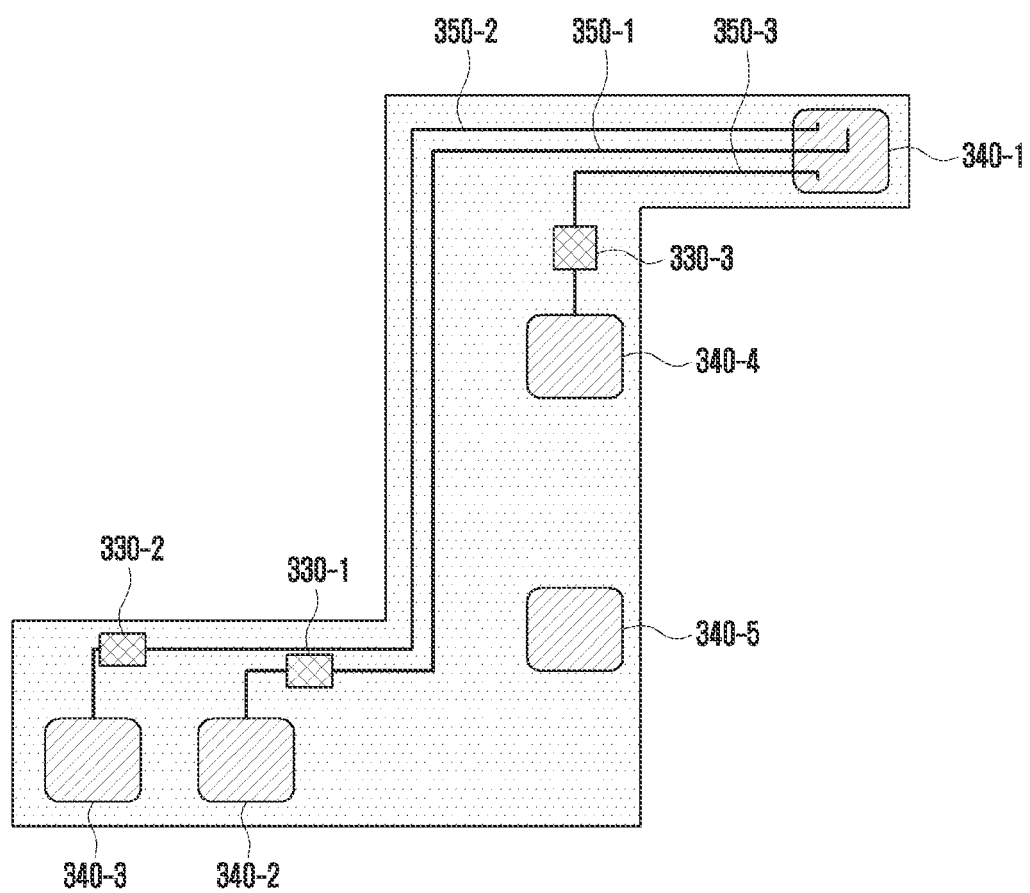
FIG. 3B is a schematic view of an electrical connection relationship of the antenna power feeding structure illustrated in FIG. 3A.
Figure 3C:
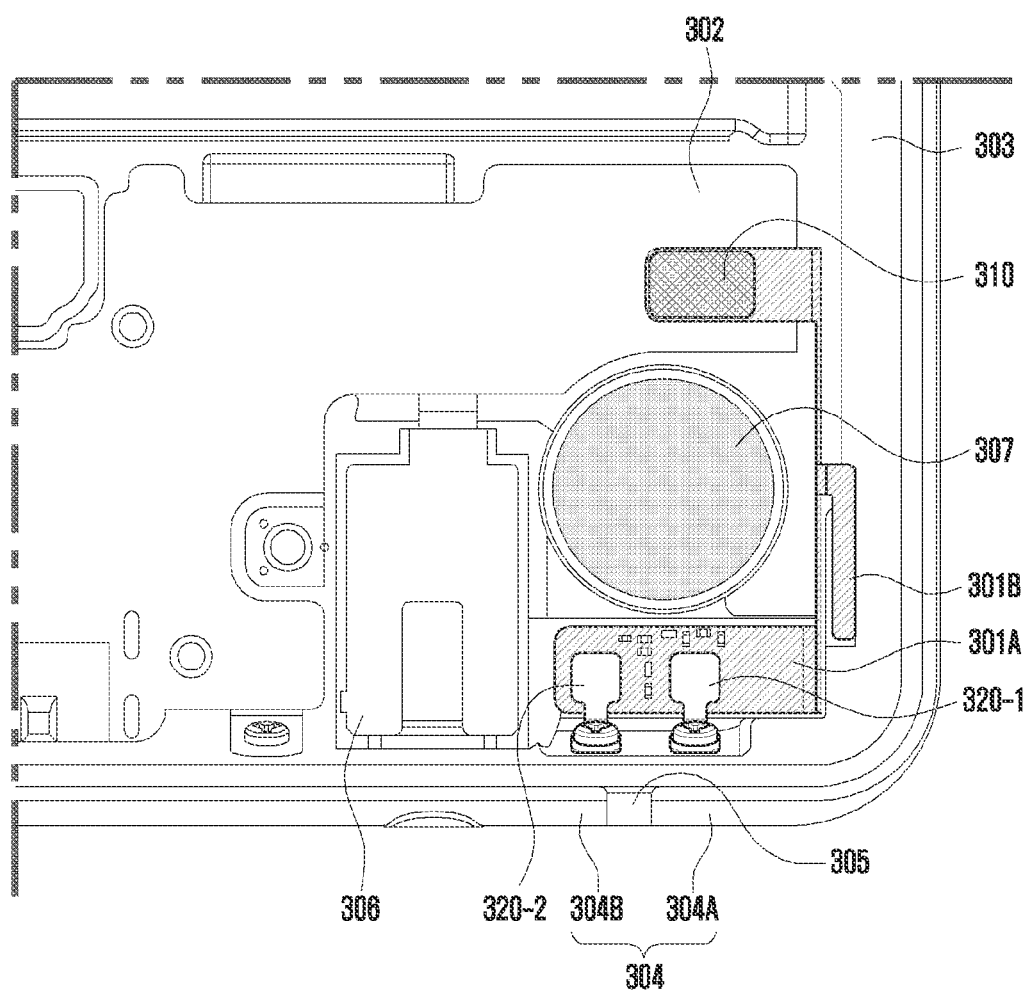
FIG. 3C is a view showing a state in which the antenna power feeding structure illustrated in FIG. 3A is disposed in an electronic device.

FIG. 3A is a perspective view of an antenna power feeding structure according to various example embodiments. FIG. 3B is a schematic view of an electrical connection relationship of the antenna power feeding structure illustrated in FIG. 3A. FIG. 3C is a view showing a state in which the antenna power feeding structure illustrated in FIG. 3A is disposed in an electronic device. FIG. 3D is a view showing performance of the additional antenna illustrated in FIG. 3A.

An antenna power feeding structure 300 illustrated in FIG. 3A may be an embodiment different from the antenna power feeding structure 300 described in FIG. 2. Detailed descriptions of elements identical to or similar to those of the antenna power feeding structure 300 described above will be omitted, and differences therebetween will be mainly explained.

According to various embodiments, the antenna power feeding structure 300 may include a flexible printed circuit board 301, a first connection part 310, a second connection part 320, and an integrated circuit 330.

According to various embodiments, the flexible printed circuit board 301 may include a first area 301A and a second area 301B branched and extended from the first area 301A. The flexible printed circuit board 301 may have a portion which is deformable (e.g., bendable) to allow the flexible printed circuit board to be efficiently disposed inside an electronic device. For example, a portion of the flexible printed circuit board 301 may be oriented in a first direction A, and a portion of the flexible printed circuit board 301 may be bent to be oriented in a second direction B different from the first direction A. Like this, the flexible printed circuit board 301 may include a surface oriented in the first direction A, and a surface oriented in the second direction B.

According to various embodiments, for example, the integrated circuit 330 may include various antenna-related circuits such as a matching circuit for impedance matching (e.g., the matching circuit 231 in FIG. 2) and a switching circuit (e.g., the switching circuit 232 in FIG. 2) for the antenna power feeding structure 300 to respond to a broadband characteristic. For example, the switching circuit may short antennas electrically opened from each other so as to increase the physical length of the antennas. The integrated circuit 330 may include a first integrated circuit 330-1, a second integrated circuit 330-2, and a third integrated circuit 330-3. For example, as illustrated in FIG. 3B, the first integrated circuit 330-1 may be disposed to be adjacent to the (2A)th connection part 320-1, the second integrated circuit 330-2 may be disposed to be adjacent to the (2B)th connection part 320-2, and the third integrated circuit 330-3 may be disposed to be adjacent to the antenna radiator 301B. The integrated circuit 330 may be disposed to be adjacent to a signal transmission or reception configuration (e.g., the frame 304 or the antenna radiator 301B) so as to reduce RF signal loss. In addition, the arrangement and number of the integrated circuit 330 may be variously changed.

According to various embodiments, in case that the (2A)th connection part 320-1 and the (2B)th connection part 320-2 are connected to one unsegmented frame (the first frame 304A or the second frame 304B), as the method in which the second integrated circuit 330-2 and/or the third integrated circuit 330-3 connects one of the (2A)th connection part 320-1 or the (2B)th connection part 320-2 to a frame, the entire length of an antenna may be changed. In addition, the (2A)th connection part 320-1 may be connected to a frame so as to transmit an RF signal, and the (2B)th connection part 320-2 may be connected to the ground.

According to various embodiments, multiple pads 340 may be arranged on the flexible printed circuit board 301 by a printing method. For example, as illustrated in FIG. 3B, a first pad 340-1 may be electrically connected to the first connection part 310, a second pad 340-2 may be electrically connected to the (2A)th connection part 320-1, and a third pad 340-3 may be electrically connected to the (2B)th connection part 320-2. In addition, a fourth pad 340-4 may be electrically connected to the antenna radiator 301B, and a fifth pad 340-5 may be electrically connected to the ground of the flexible printed circuit board 301. The fifth pad 340-5 may be electrically connected to the ground of an electronic device through a separate connection member (not shown). Here, the connection member for electrically connecting the fifth pad 340-5 and the ground of an electronic device may have a shape similar to the second connection part 320 in FIG. 3A. In an embodiment, the second pad 340-2 may be electrically connected to the first integrated circuit 330-1, the third pad 340-3 may be electrically connected to the second integrated circuit 330-2, and the fourth pad 340-4 may be electrically connected to the third integrated circuit 330-3.

According to various embodiments, a transmission line 350 may be disposed on the flexible printed circuit board 301. The transmission line 350 may transmit a communication signal generated in a communication module (e.g., the communication module 190 in FIG. 1) of an electronic device or a communication signal received from the outside. The transmission line 350 may include a first line 350-1 for connecting the first pad 340-1 and the first integrated circuit 330-1, a second line 350-2 for connecting the first pad 340-1 and the second integrated circuit 330-2, and a third line 350-3 for connecting the first pad 340-1 and the third integrated circuit 330-3. The ground may be disposed around the transmission line 350. Descriptions of the arrangement of the transmission line 350 and the ground may be referred to FIG. 4A.

According to various embodiments, the second area 301B may operate as an antenna radiator 301B for transmitting or receiving a high frequency RF signal. The second area 301B may be electrically connected to a main board 302. The second area 301B may be connected to a communication module disposed on the main board 302 so as to transmit or receive an RF signal. In an embodiment, the second area 301B may be the flexible printed circuit board 301 identical to the first area 301A. An antenna pattern may be disposed in the second area 301B, and thus the second area 301B may operate as an antenna radiator. As illustrated in FIG. 3C, the second area 301B of the flexible printed circuit board 301 may have at least a portion supported by the plate 303 of an electronic device, inside the frame 304 formed of a metal material. In case of an antenna for transmitting or receiving a high frequency signal, even though the antenna is positioned inside the frame 304 made of a metal material, the performance thereof may be less affected. As the second area 301B illustrated in FIG. 3A, the shape of the flexible printed circuit board 301 may be partially changed, and thus a portion of the flexible printed circuit board 301 may function as an antenna. In an embodiment, a matching circuit (e.g., the matching circuit 231 in FIG. 2) capable of being included in the integrated circuit 330 may be disposed to be adjacent to a point at which the second area 301B is branched from the first area 301A. Referring to FIG. 3D, it may be identified that the second area 301B functioning as an additional antenna can easily transmit or receive a communication signal in a band of 4800 MHZ to 5200 MHz or a band of 7000 MHz or higher. Frequencies of various bands may be transmitted or received by variously changing a resonance frequency according to the length of an antenna pattern disposed in the second area 301B. For example, the length of an antenna pattern may be adjusted to transmit or receive a communication signal in 2.4 GHz or 1.5 GHz band.

According to various embodiments, at least a portion of the flexible printed circuit board 301 may be supported by a plate 303 of an electronic device, which is disposed inside a frame 304 made of a metal material. The plate 303 may support various elements of an electronic device.

According to various embodiments, the flexible printed circuit board 301 may be disposed to be adjacent to the frame 304 of an electronic device. For example, the flexible printed circuit board 301 may be disposed between the main board 302 and the frame 304 of an electronic device. For example, the flexible printed circuit board 201 may be disposed to be closer to the first frame 304 than the main board 302 of an electronic device. As illustrated in FIG. 3C, the flexible printed circuit board 301 may be disposed to avoid elements (e.g., the vibration motor 307 and the earphone hole 306) of an electronic device. As described above, since the flexible printed circuit board 301 is deformable, the flexible printed circuit board 301 may be disposed to avoid interference with other elements of an electronic device in a small space inside an electronic device. By disposing an element for performing an antenna function on the flexible printed circuit board 301, it may be possible to dispose the antenna power feeding structure 300 in a space of an electronic device, which has been difficult to utilize in the prior art.

According to various embodiments, the first connection part 310 may electrically connect the main board 302 and the flexible printed circuit board 301. The frame 304 of an electronic device may be segmented into the first frame 304A and the second frame 304B by an insulation material 305. The length of the segmented frames 304A and 304B may be changed according to a communication frequency used in an electronic device. The first frame 304A having a long length may be used as an antenna for a relatively low-frequency communication signal, and the second frame 304B having a short length may be used as an antenna for a relatively high-frequency communication signal. For example, as illustrated in FIG. 3C, the frame 304 may be segmented into the first frame 304A and the second frame 304B. Multiple second connection parts (the (2A)th connection part 320-1 and the (2B)th connection part 320-2) may electrically connect the segmented frames 304A and 304B to the flexible printed circuit board 301. Referring to FIG. 3C, the (2A)th connection part 320-1 may connect the first frame 304A and flexible printed circuit board 301, and the (2B)th connection part 320-2 may electrically connect the second frame 304B and the flexible printed circuit board 301. A part of an RF signal transmitted through the flexible printed circuit board 301 may be transmitted through the first frame 304A, and a part thereof may be transmitted through the second frame 304B. In some cases, the first frame 304A and the second frame 304B may be short-circuited by a switching circuit of the integrated circuit 330. According to an operation or a state of an electronic device related to communication, the first frame 304A may be used as an antenna by transmitting an RF signal to the first frame 304A through the (2A)th connection part 320-1, and the second frame 304B may be used as an antenna by transmitting an RF signal to the second frame 304B through the (2B)th connection part 320-2. In addition, the first frame 304A and the second frame 304B may be used as antennas for transmitting communication signals of different bands. For example, a signal may be transmitted from the (2A)th connection part 320-1 to the first frame 304A so that a low-band or a mid-band RF signal is transmitted to the first frame 304A. A signal may be transmitted from the (2B)th connection part 320-2 to the second frame 304B so that a high-band RF signal is transmitted through to second frame 304B. As described above, communication signals may be transmitted in various methods through the first frame 304A and the second frame 304B shorted to each other.

In the above, although it has been described that the antenna power feeding structure 300 includes a flexible printed circuit board 301, the antenna power feeding structure 300 may include a printed circuit board made of an inflexible material. In addition, a partial area of the antenna power feeding structure 300 may be provided with a printed circuit board made of a flexible material, and a partial area thereof may be provided with a printed circuit board made of an inflexible material.

Figure 4A:
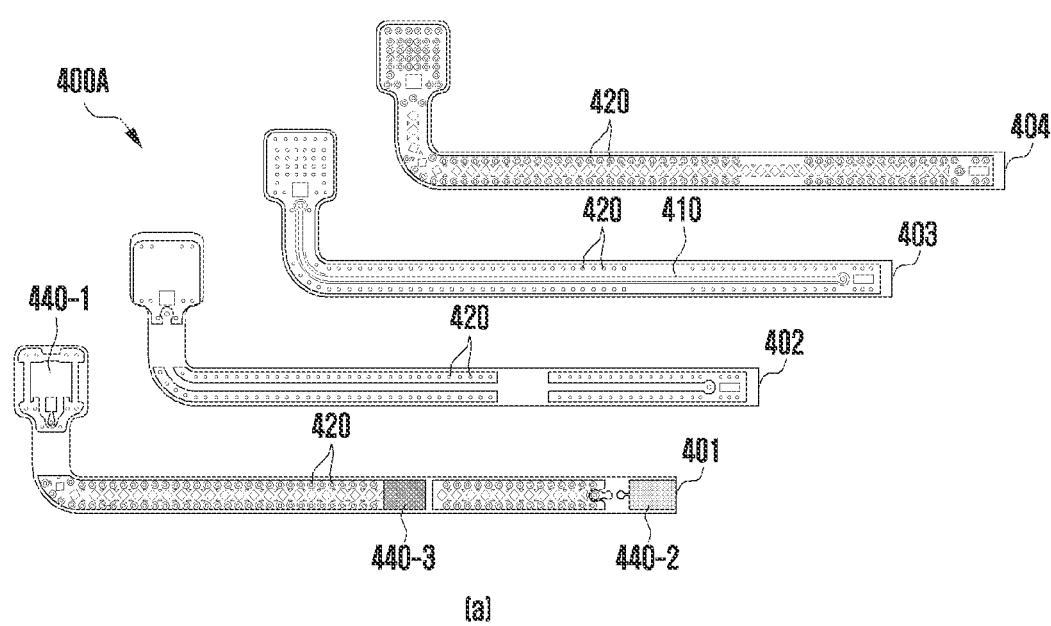
FIG. 4A is a view showing a multi-layer structure of a flexible printed circuit board according to various example embodiments.
Figure 4A:
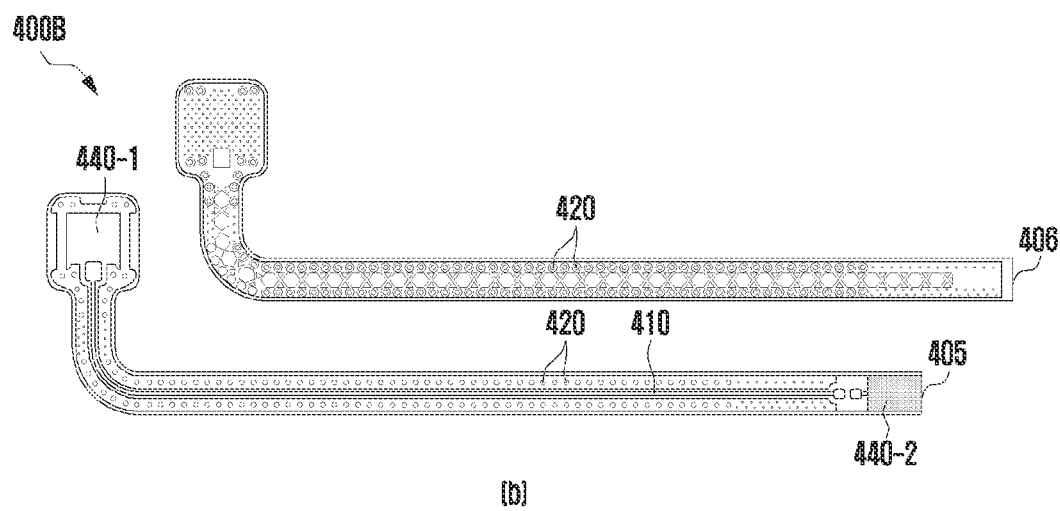
Figure 4B:
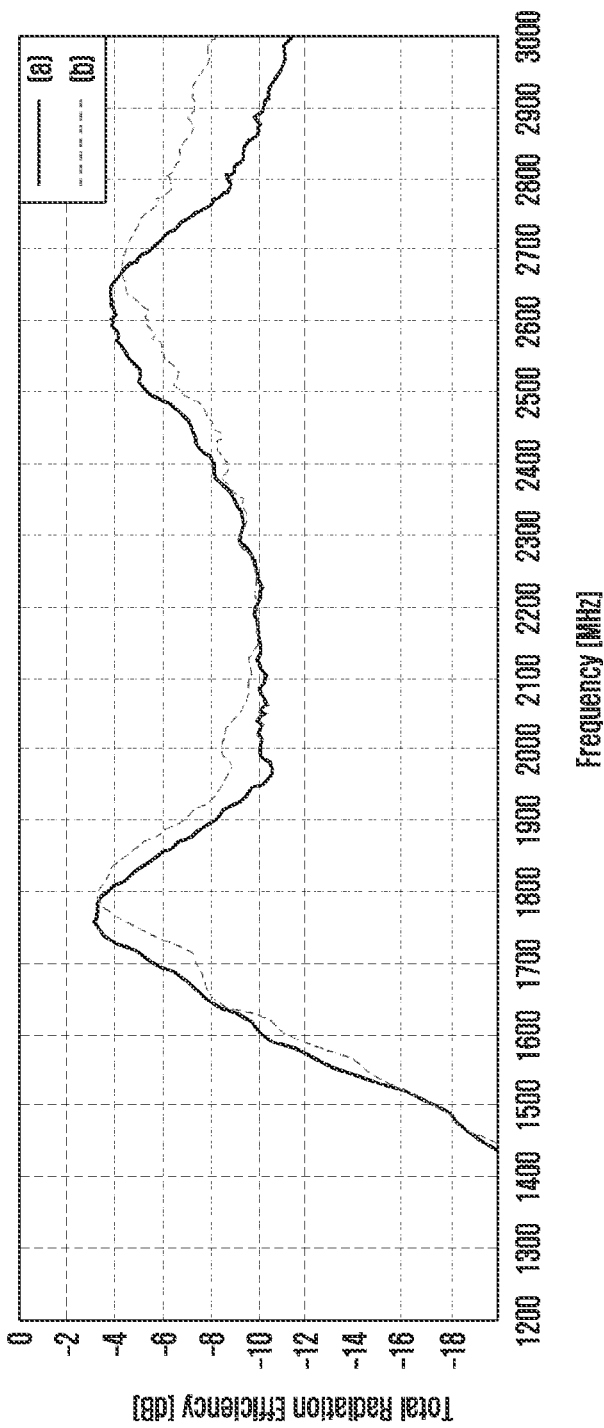
FIG. 4B is a view showing performance according to a structure of the flexible printed circuit board illustrated in FIG. 4A.

FIG. 4A is a view showing a multi-layer structure of a flexible printed circuit board according to various example embodiments. FIG. 4B is a view showing performance according to a structure of the flexible printed circuit board illustrated in FIG. 4A. The flexible printed circuit board illustrated in FIG. 4A and FIG. 4B may be one of various examples of the flexible printed circuit board included in the antenna power feeding structure described through FIG. 2 and FIG. 3A.

According to various embodiments, a flexible printed circuit board 400A or 400B may include multiple layers. For example, as illustrated in (a) of FIG. 4A, the flexible printed circuit board 400A may include four layers 401, 402, 403, and 404, and as illustrated in (b) of FIG. 4A, the flexible printed circuit board 400B may include two layers 405 and 406.

Referring to (a) of FIG. 4A, a conductive pad 440 may be disposed on one 401 of the layers of the flexible printed circuit board 400A. For example, the conductive pad 440 may include a first pad 440-1, a second pad 440-2, and a third pad 440-3. The first pad 440-1 may be electrically connected to a first connection part (e.g., the first connection part 310 in FIG. 3A) for connecting the flexible printed circuit board 400A and a main board of an electronic device. The second pad 440-2 may be electrically connected to a frame (e.g., the frame 304 in FIG. 3C) of an electronic device, which is made of a conductive material. The second pad 440-2 may be electrically connected to a frame of an electronic device by a second connection part (e.g., the second connection part 320 in FIG. 3A). The third pad 440-3 may be electrically connected to a ground VIA 420 of the flexible printed circuit board 400A. The third pad 440-3 may be electrically connected to the ground of an electronic device through a connection member. A connection member for connecting the third pad 440-3 to the ground of the electronic device may have a shape similar to a connection member (e.g., the second connection part 320 in FIG. 3A) for connecting the second pad 440-2 to a frame of an electronic device.

Referring to (b) of FIG. 4B, a conductive pad 440 may be disposed on one 405 of the layers of the flexible printed circuit board 400B. For example, a conductive pad 440 may include a first pad 440-1 and a second pad 440-2. The first pad 440-1 may be electrically connected to a first connection part (e.g., the first connection part 310 in FIG. 3A) for connecting the flexible printed circuit board 400B and a main board of an electronic device. The second pad 440-2 may be electrically connected to a frame (e.g., the frame 304 in FIG. 3C) of an electronic device, which is made of a conductive material. The second pad 440-2 may be electrically connected to a frame of an electronic device by a second connection part (e.g., the second connection part 320 in FIG. 3A).

According to various embodiments, at least one signal line 410 may be disposed on at least one layer (e.g., the layer 403 of (a) of FIG. 4A or the layer 405 of (b) of FIG. 4A) among the multiple layers. An RF signal may be transmitted through the signal line 410. In addition, a ground VIA 420 may be disposed around the signal line 410. The ground VIA 420 may be formed in a direction perpendicular to the extension direction of the signal line 410 and may be connected to the ground. The ground VIA 420 may be formed to penetrate the multiple layers. An RF signal transmitted to the signal line 410 may be shielded by the ground VIA 420 disposed around the signal line 410. The ground VIA 420 may reduce the influence of an electromagnetic wave capable of being emitted from electronic components arranged to be adjacent to the flexible printed circuit board 400 on the signal line 410.

According to a layer structure of a flexible printed circuit board, the radiation efficiency of an antenna power feeding structure may vary. Referring to FIG. 4B, it may be identified that in the band of about 1800 MHZ to about 2100 MHZ, the radiation efficiency of an antenna power feeding structure including the flexible printed circuit board 400B including two layers is higher than the radiation efficiency of an antenna power feeding structure including the flexible printed circuit board 400A including four layers, and in the band of about 2200 MHz to about 2700 MHZ, the radiation efficiency of the antenna power feeding structure including the flexible printed circuit board 400A including four layers is higher than the radiation efficiency of the antenna power feeding structure including the flexible printed circuit board 400B including two layers. According to a frequency band in which an antenna power feeding structure mainly transmits or receives, the number of layers of a flexible printed circuit board may be changed.

Figure 5A:
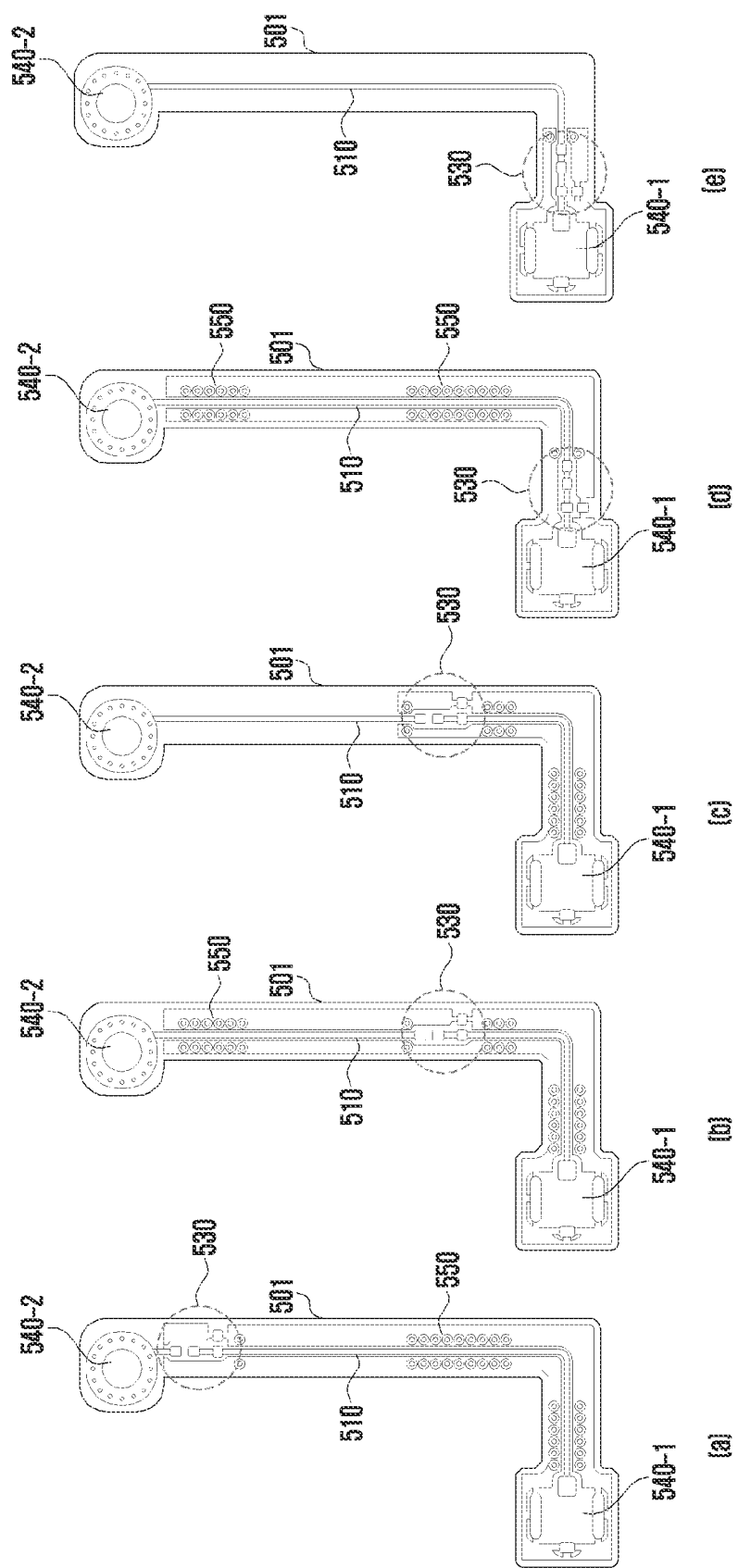
FIG. 5A is a view of a flexible printed circuit board according to various example embodiments.
Figure 5B:
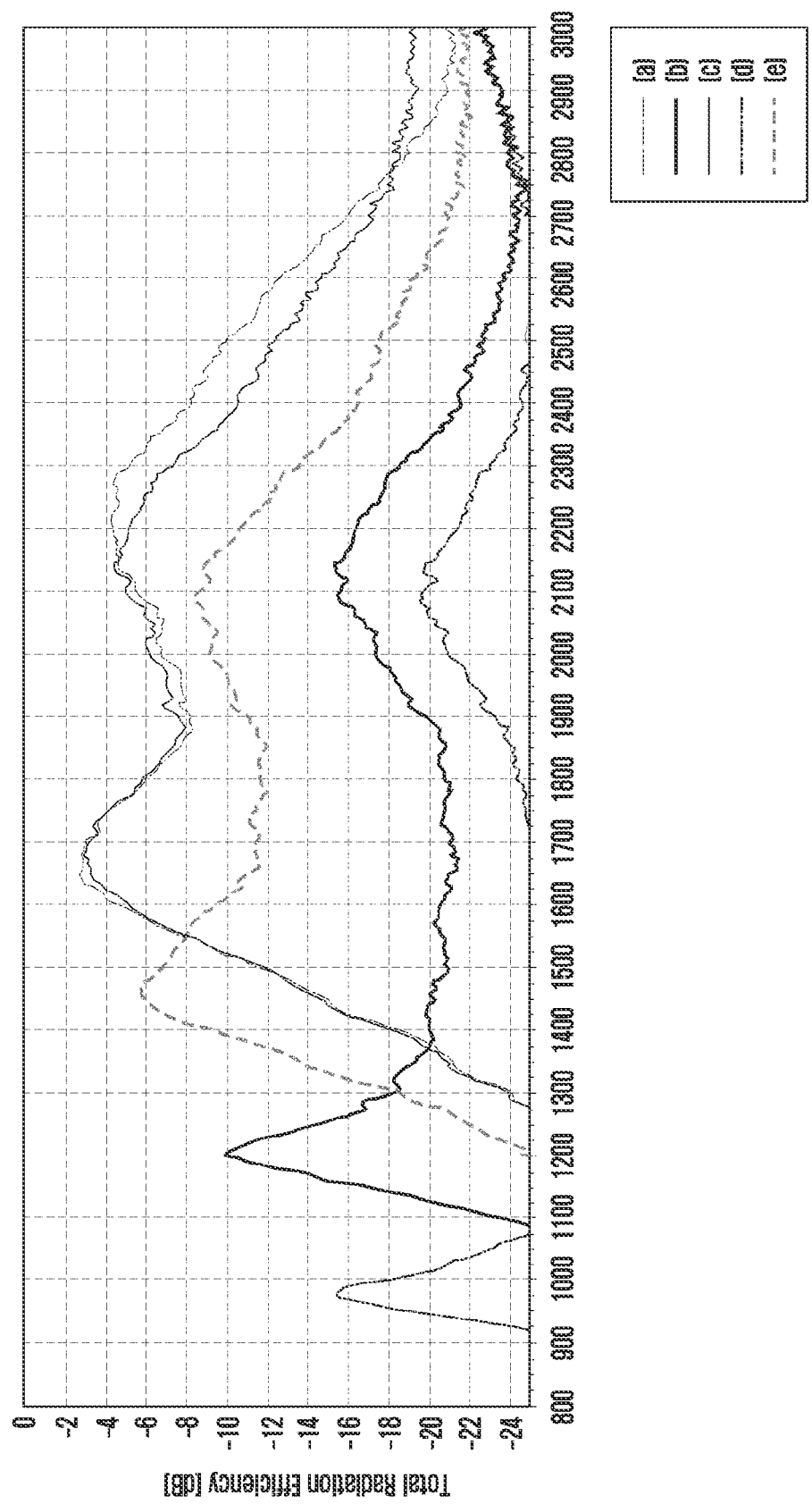
FIG. 5B is a view showing performance of an antenna power feeding structure including a flexible printed circuit board according to various example embodiments illustrated in FIG. 5A.

FIG. 5A is a view of a flexible printed circuit board according to various example embodiments. FIG. 5B is a view showing performance of an antenna power feeding structure including a flexible printed circuit board according to various embodiments illustrated in FIG. 5A. Various flexible printed circuit boards illustrated in FIG. 5A may be various examples of the flexible printed circuit board included in the antenna power feeding structure described through FIG. 2 and FIG. 3A.

Referring to (a) of FIG. 5A, a conductive pad 540 may be disposed on a flexible printed circuit board 501. For example, the conductive pad 540 may include a first pad 540-1 and a second pad 540-2. The first pad 540 may be electrically connected to a first connection part (e.g., the first connection part 310 in FIG. 3A) for connecting the flexible printed circuit board 501 and a main board of an electronic device. The second pad 540-2 may be electrically connected to a frame (e.g., the frame 304 in FIG. 3C) of an electronic device, which is made of a conductive material. The second pad 540-2 may be electrically connected to a frame of an electronic device by a second connection part (e.g., the second connection part 320 in FIG. 3A). In some cases, an opening may be formed through the second pad 540-2, a bolt may be inserted into the opening formed through the second pad 540-2, and then the bolt may be bolt-coupled to a screw groove formed on a frame of an electronic device. Therefore, the second pad 540-2 and the frame of the electronic device may be electrically connected.

According to various embodiments, a signal line 510 for transmitting an RF signal and a ground VIA 550 disposed around the signal line 510 may be disposed on the flexible printed circuit board 501. The signal line 510 may electrically connect the first pad 540-1 and the second pad 540-2. Since the elements described directly above are substantially the same as the elements described above, detailed descriptions thereof will be omitted.

The distance between the second pad 540-2 and a matching circuit 530 included in an integrated circuit or the arrangement of the ground VIA 550 of the flexible printed circuit board 501 may be variously changed. The (a) of FIG. 5A shows the case in which the second pad 540-2 and the matching circuit 530 are arranged to be spaced apart by about 0.5 mm, the (b) thereof shows the case in which the second pad 540-2 and the matching circuit 530 are arranged to be spaced apart by about 9 mm, the (c) thereof shows the case in which the second pad 540-2 and the matching circuit 530 are arranged to be spaced apart by about 9 mm and which is the same as the (b), but the case of (c) is a case in which the ground VIA 550 is not disposed between the second pad 540-2 and the matching circuit 530, the (d) thereof shows the case in which the second pad 540-2 and the matching circuit 530 are arranged to be spaced apart by about 16 mm, and the (e) thereof shows the case in which the second pad 540-2 and the matching circuit 530 are arranged to be spaced apart by about 16 mm and which is the same as the (d), but the case of (e) is a case in which the ground VIA 550 is not disposed between the second pad 540-2 and the matching circuit 530.

Referring to FIG. 5B, it may be identified that the case of (a) has the best radiation efficiency in the band of about 1600 MHz to about 2800 MHZ. In addition, comparing (b) and (c), it may be identified that the case of (c) in which the ground VIA 550 does not exist between the second pad 540-2 and the matching circuit 530 has relatively better radiation efficiency than the case of (b). Comparing (d) and (e), it may be identified that the case of (e) in which the ground VIA 550 does not exist between the second pad 540-2 and the matching circuit 530 has relatively better radiation efficiency than the case of (d). Through the experimental results, it may be identified that a design factor capable of increasing radiation efficiency is that the second pad 540-2 and the matching circuit 530 are closely arranged and that the ground VIA 550 is not disposed between the second pad 540-2 and the matching circuit 530. Therefore, in designing the antenna power feeding structure disclosed in the document, the matching circuit 530 may be disposed to be adjacent to the second pad 540-2, and the ground VIA 550 may not be disposed between the matching circuit 530 and the second pad 540-2.

An electronic device according to various example embodiments may include a main board, a frame having at least a portion exposed to the outside of the electronic device and formed of a metal material, a flexible printed circuit board having at least a portion disposed to be adjacent to the frame, a first connection part configured to electrically connect the flexible printed circuit board and the main board, a second connection part formed to be bendable and configured to electrically connect the flexible printed circuit board and the frame, and an integrated circuit disposed on the flexible printed circuit board.

In addition, the second connection part may be formed of a conductive material and may be coupled to the frame by a bolt inserted in a screw hole formed through the second connection part.

In addition, a plate positioned inside the frame may be included therein, and the flexible printed circuit board may have at least a portion supported by the plate.

In addition, the flexible printed circuit board may be formed in a shape capable of being disposed in a space between the main board and the frame.

In addition, the flexible printed circuit board may include a first area in which the first connection part and the second connection part are positioned, and at least one second area configured to branch and extend from the first area, and the at least one second area of the flexible printed circuit board may be an antenna radiator configured to transmit or receive an RF signal.

In addition, the flexible printed circuit board may include at least one antenna radiator formed of a conductive material, electrically connected to the flexible printed circuit board, and configured to transmit or receive an RF signal.

In addition, the frame may be segmented into multiple areas including a first area and a second area by an insulation material.

In addition, multiple second connection parts may be provided, at least one of the multiple second connection parts may be configured to electrically connect the first area of the frame and the flexible printed circuit board, and at least one of the multiple second connection parts may be configured to electrically connect the second area of the frame and the flexible printed circuit board.

In addition, the flexible printed circuit board may include multiple layers, a signal line for transmitting an RF signal may be disposed on at least one of the multiple layers, and a ground VIA formed to penetrate the multiple layers may be disposed around the signal line.

In addition, the integrated circuit may include a matching circuit for impedance matching, and the matching circuit may be disposed in a portion adjacent to a portion in which the second connection part and the flexible printed circuit board are connected to each other.

An antenna power feeding structure according to various example embodiments may include a flexible printed circuit board disposed to be adjacent to a frame of an electronic device, which is formed of a metal material, a first connection part configured to electrically connect the flexible printed circuit board and a main board of the electronic device, a second connection part formed to be bendable and configured to electrically connect the flexible printed circuit board and the frame of the electronic device, and an integrated circuit disposed on the flexible printed circuit board.

In addition, the second connection part may be formed of a conductive material and may be coupled to the frame of the electronic device by a bolt inserted in a screw hole formed through the second connection part.

In addition, the flexible printed circuit board may have at least a portion supported by a plate disposed inside the frame of the electronic device.

In addition, the flexible printed circuit board may be formed in a shape capable of being disposed in a space between the main board of the electronic device and the frame of the electronic device.

In addition, the flexible printed circuit board may include a first area in which the first connection part and the second connection part are positioned, and at least one second area configured to branch and extend from the first area, and the at least one second area of the flexible printed circuit board may be an antenna radiator configured to transmit or receive an RF signal.

In addition, the flexible printed circuit board may include at least one antenna radiator formed of a conductive material, electrically connected to the flexible printed circuit board, and configured to transmit or receive an RF signal.

In addition, multiple second connection parts may be provided, at least one of the multiple second connection parts may be configured to electrically connect a first area of the frame and the flexible printed circuit board, and at least one of the multiple second connection parts may be configured to electrically connect a second area segmented from the first area of the frame by an insulation material and the flexible printed circuit board.

In addition, the flexible printed circuit board may include multiple layers, at least one signal line for transmitting an RF signal may be disposed on at least one of the multiple layers, and a ground VIA formed to penetrate the multiple layers may be disposed around the signal line.

In addition, a matching circuit for impedance matching may be disposed on the flexible printed circuit board, and the matching circuit may be disposed in a portion adjacent to a portion in which the second connection part and the flexible printed circuit board are connected.

In addition, in the flexible printed circuit board, the flexible printed circuit board may include a surface oriented in a first direction, and a surface oriented in a second direction different from the first direction.

Various embodiments as described above may be diversely combined to the extent that they do not contradict each other.

The embodiments of the disclosure described and shown in the specification and the drawings are merely specific examples that have been presented to easily explain the technical contents of the disclosure and help understanding of the disclosure, and are not intended to limit the scope of the disclosure. Therefore, the scope of the disclosure should be construed to include, in addition to the embodiments disclosed herein, all changes and modifications derived on the basis of the technical idea. While the disclosure has been illustrated and described with reference to various embodiments, it will be understood that the various embodiments are intended to be illustrative, not limiting. It will further be understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

The invention claimed is:

1. An electronic device comprising:
   a main board;
   a frame comprising at least a portion exposed to the outside of the electronic device and comprising metal material;
   a flexible printed circuit board comprising at least a portion disposed to be adjacent to the frame;
   a first connection part, comprising conductive material, configured to electrically connect the flexible printed circuit board and the main board;
   a second connection part, comprising conductive material, configured to be bendable and electrically connect the flexible printed circuit board and the frame; and
   an integrated circuit disposed on the flexible printed circuit board, wherein the frame is segmented into at least a first area and a second area, wherein lengths of the first and second areas are configured to be changed according to a communication frequency used in the electronic device, and wherein the first area and the second area are used as antennas for transmitting communication signals of different bands.

2. The electronic device of claim 1, wherein the second connection part is coupled to the frame by a bolt inserted in a screw hole formed through the second connection part.

3. The electronic device of claim 1, further comprising a plate positioned inside the frame,
wherein the flexible printed circuit board has at least a portion supported by the plate.

4. The electronic device of claim 1, wherein the flexible printed circuit board comprises a shape capable of being disposed in a space between the main board and the frame.

5. The electronic device of claim 1, wherein the flexible printed circuit board comprises a first area in which the first connection part and the second connection part are positioned, and at least one second area configured to branch and extend from the first area, and wherein the at least one second area of the flexible printed circuit board comprises an antenna radiator configured to transmit and/or receive an RF signal.

6. The electronic device of claim 1, wherein the flexible printed circuit board comprises at least one antenna radiator comprising conductive material, electrically connected to the flexible printed circuit board, and configured to transmit and/or receive an RF signal.

7. The electronic device of claim 1, wherein the frame is segmented into multiple areas, comprising the first area and the second area, by at least an insulation material.

8. The electronic device of claim 7, wherein multiple second connection parts are provided,
wherein at least one of the multiple second connection parts is configured to electrically connect the first area of the frame and the flexible printed circuit board, and
wherein at least one of the multiple second connection parts is configured to electrically connect the second area of the frame and the flexible printed circuit board.

9. The electronic device of claim 1, wherein the flexible printed circuit board comprises multiple layers,
wherein a signal line for transmitting an RF signal is disposed on at least one of the multiple layers, and
wherein a ground via formed to penetrate the multiple layers is disposed around the signal line.

10. The electronic device of claim 1, wherein the integrated circuit comprises a matching circuit for impedance matching, and
wherein the matching circuit is disposed in a portion adjacent to a portion in which the second connection part and the flexible printed circuit board are connected to each other.

11. An antenna power feeding structure comprising:
a flexible printed circuit board disposed to be adjacent to a frame of an electronic device comprising metal material;
a first connection part, comprising conductive material, and configured to electrically connect the flexible printed circuit board and a main board of the electronic device;
a second connection part, comprising conductive material, configured to be bendable, and to electrically connect the flexible printed circuit board and the frame of the electronic device; and
an integrated circuit disposed on the flexible printed circuit board,
wherein the flexible printed circuit board comprises:
a first area in which the first connection part and the second connection part are positioned, the first area including a first surface on which at least one pad electrically connected to the first connection part or the second connection part is disposed, and
at least one second area configured to branch and extend from a second surface of the first area, the second surface being opposite to the first surface.

12. The antenna power feeding structure of claim 11, wherein the second connection part is coupled to the frame of the electronic device at least by a bolt inserted in a screw hole formed through the second connection part.

13. The antenna power feeding structure of claim 11, wherein the flexible printed circuit board comprising at least a portion supported by a plate disposed at least partially inside the frame of the electronic device.

14. The antenna power feeding structure of claim 11, wherein the flexible printed circuit board is formed in a shape to be disposed in a space between at least the main board of the electronic device and the frame of the electronic device, and comprises a surface oriented in a first direction and a surface oriented in a second direction different from the first direction.

15. The antenna power feeding structure of claim 11, wherein
the at least one second area of the flexible printed circuit board comprises an antenna radiator configured to transmit and/or receive an RF signal.

* * * * *